(12) United States Patent
Lai et al.

(10) Patent No.: US 7,531,825 B2
(45) Date of Patent: May 12, 2009

(54) METHOD FOR FORMING SELF-ALIGNED THERMAL ISOLATION CELL FOR A VARIABLE RESISTANCE MEMORY ARRAY

(75) Inventors: Erh-Kun Lai, Longjing Shiang (TW); Chiahua Ho, Kaoshing (TW); Kuang Yeu Hsieh, Hsinchu County (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 11/463,824

(22) Filed: Aug. 10, 2006

(65) Prior Publication Data

US 2007/0158633 A1    Jul. 12, 2007

Related U.S. Application Data

(60) Provisional application No. 60/754,161, filed on Dec. 27, 2005.

(51) Int. Cl.
*H01L 47/00* (2006.01)
*G11C 11/56* (2006.01)

(52) U.S. Cl. ................... 257/4; 257/2; 257/3; 257/5; 257/E27.104; 365/148

(58) Field of Classification Search ............ 257/2, 257/3, 4, 5, E27.104, E29.17; 365/148
See application file for complete search history.

(56) References Cited

U.S. PATENT DOCUMENTS 3,271,591 A    9/1966 Ovshinsky (Continued)

FOREIGN PATENT DOCUMENTS

| WO | WO 00/45108 A1 | 8/2000 |
|---|---|---|
| WO | WO 00/79539 A1 | 12/2000 |
| WO | WO 01/45108 A1 | 6/2001 |

OTHER PUBLICATIONS

Gibson, G.A. et al., "Phase-change Recording Medium that Enables Ultrahigh-density Electron-beam Data Storage," Applied Physics Letter, 2005, 3 pp., vol. 86.
Hudgens, S. et al., "Overview of Phase-Change Chalcogenide Non-volatile Memory Technology," MRS Bulletin, Nov. 2004, pp. 829-832.
"Magnetic Bit Boost," www.sciencenews.org <http://www.sciencenews.org>, Dec. 18 & 25, 2004, p. 389, vol. 166.

(Continued)

*Primary Examiner*—Evan Pert
*Assistant Examiner*—Selim Ahmed
(74) *Attorney, Agent, or Firm*—Haynes Beffel & Wolfeld LLP (57) ABSTRACT

A non-volatile method with a self-aligned RRAM element. The method includes a lower electrode element, generally planar in form, having an inner contact surface. At the top of the device is a upper electrode element, spaced from the lower electrode element. A containment structure extends between the upper electrode element and the lower electrode element, and this element includes a sidewall spacer element having an inner surface defining a generally funnel-shaped central cavity, terminating at a terminal edge to define a central aperture; and a spandrel element positioned between the sidewall spacer element and the lower electrode, having an inner surface defining a thermal isolation cell, the spandrel inner walls being spaced radially outward from the sidewall spacer terminal edge, such that the sidewall spacer terminal edge projects radially inward from the spandrel element inner surface. A RRAM element extends between the lower electrode element and the upper electrode, occupying at least a portion of the sidewall spacer element central cavity and projecting from the sidewall spacer terminal edge toward and making contact with the lower electrode. In this manner, the spandrel element inner surface is spaced from the RRAM element to define a thermal isolation cell adjacent the RRAM element.

12 Claims, 5 Drawing Sheets

U.S. PATENT DOCUMENTS

| | | |
|---|---|---|
| 3,530,441 A | 9/1970 | Ovshinsky |
| 4,599,705 A | 7/1986 | Holmberg et al. |
| 4,719,594 A | 1/1988 | Young et al. |
| 4,876,220 A | 10/1989 | Mohsen et al. |
| 4,959,812 A | 9/1990 | Momodomi et al. |
| 5,166,096 A | 11/1992 | Cote et al. |
| 5,166,758 A | 11/1992 | Ovshinsky et al. |
| 5,177,567 A | 1/1993 | Klersy et al. |
| 5,515,488 A | 5/1996 | Hoppe et al. |
| 5,534,712 A | 7/1996 | Ovshinsky et al. |
| 5,687,112 A | 11/1997 | Ovshinsky |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,920,788 A | 7/1999 | Reinberg |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,314,014 B1 | 11/2001 | Lowrey et al. |
| 6,320,786 B1 | 11/2001 | Chang et al. |
| 6,339,544 B1 | 1/2002 | Chiang et al. |
| 6,351,406 B1 | 2/2002 | Johnson et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,534,781 B2 | 3/2003 | Dennison |
| 6,545,903 B1 | 4/2003 | Wu |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,744,088 B1 | 6/2004 | Dennison |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,830,952 B2 | 12/2004 | Lung et al. |
| 6,850,432 B2 | 2/2005 | Lu et al. |
| 6,859,389 B2 | 2/2005 | Idehara et al. |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,305 B2 | 5/2005 | Yi et al. |
| 6,903,362 B2 | 6/2005 | Wyeth et al. |
| 6,909,107 B2 | 6/2005 | Rodgers et al. |
| 6,927,410 B2 | 8/2005 | Chen |
| 6,933,516 B2 | 8/2005 | Xu |
| 6,936,840 B2 | 8/2005 | Sun et al. |
| 6,937,507 B2 | 8/2005 | Chen |
| 6,992,932 B2 | 1/2006 | Cohen |
| 7,023,009 B2 | 4/2006 | Kostylev et al. |
| 7,033,856 B2 | 4/2006 | Lung et al. |
| 7,042,001 B2 | 5/2006 | Kim et al. |
| 7,067,865 B2 | 6/2006 | Lung et al. |
| 7,126,149 B2 | 10/2006 | Iwasaki et al. |
| 7,132,675 B2 | 11/2006 | Gilton |
| 7,166,533 B2 | 1/2007 | Happ |
| 7,214,958 B2 | 5/2007 | Happ |
| 7,220,983 B2 | 5/2007 | Lung |
| 2004/0051094 A1 | 3/2004 | Ooishi |
| 2004/0248339 A1 | 12/2004 | Lung |
| 2005/0029502 A1 | 2/2005 | Hudgens |
| 2005/0093022 A1 | 5/2005 | Lung |
| 2005/0167656 A1 | 8/2005 | Sun et al. |
| 2005/0201182 A1 | 9/2005 | Osada et al. |
| 2005/0212024 A1 | 9/2005 | Happ |
| 2005/0215009 A1 | 9/2005 | Cho |
| 2006/0108667 A1 | 5/2006 | Lung |
| 2006/0110878 A1 | 5/2006 | Lung et al. |
| 2006/0118913 A1 | 6/2006 | Yi et al. |
| 2006/0175599 A1 | 8/2006 | Happ |
| 2006/0226409 A1* | 10/2006 | Burr et al. ..................... 257/2 |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2007/0010054 A1* | 1/2007 | Fan et al. ................... 438/257 |
| 2007/0030721 A1 | 2/2007 | Segal et al. |
| 2007/0037101 A1 | 2/2007 | Morioka |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |

| | | |
|---|---|---|
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0147105 A1 | 6/2007 | Lung et al. |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0257300 A1 | 11/2007 | Ho et al. |

OTHER PUBLICATIONS

"New Memories Tap Spin, Gird for Battle," Science News, Apr. 3, 1999, p. 223, vol. 155.

Pirovano, Agostino et al., "Reliability Study of Phase-Change Nonvolatile Memories," IEEE Transactions on Device and Materials Reliability, Sep. 2004, pp. 422-427, vol. 4, No. 3.

Radaelli, A. et al., "Electronic Switching Effect and Phase-Change Transition in Chalcogenide Materials," IEEE Electron Device Letters, Oct. 2004, pp. 684-686, vol. 25, No. 10.

"Remembering on the Cheap," www.sciencenews.org <http://www.sciencenews.org>, Mar. 19, 2005, p. 189, vol. 167.

Wuttig, Matthias, "Towards a Universal Memory?" Nature Materials, Apr. 2005, pp. 265-266, vol. 4.

Ahn, S. J. et al., "Highly Reliable 5nm Contact Cell Technology for 256Mb PRAM," VLSI Technology, Digest of Technical Papers, Jun. 14-16, 2005, pp. 98-99.

Adler, David, "Amorphous-Semiconductor Devices," Sci. Amer., vol. 236, pp. 36-48, May 1977.

Adler, D., et al., "Threshold Switching in Chalcogenide-Glass Thin Films," J. Appl/ Phys 51 (6), Jun. 1980, pp. 3289-3309.

Ahn, S.J. et al., "A Highly Manufacturable High Density Phase Change Memory of 64 Mb and Beyond," IEEE IEDM 2004, pp. 907-910.

Axon Technologies Corporation paper: Technology Description, pp. 1-6.

Bedeschi, F., et al., "4-MB MOSFET-Selected Phase-Change Memory Experimental Chip," IEEE, 2004, 4 pp.

Blake thesis, "Investigation of GeTeSb5 Chalcogenide Films for Use as an Analog Memory," AFIT/GE/ENG/00M-04, Mar. 2000, 121 pages.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell fro Phase Change RAM Featuring Very Low Power Consumption," 2003 Symposium on VLSI Technology Digest of Technical Papers, pp. 175-176.

Happ, T. D. et al., "Novel Non-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4 pp.

Horii, H. et al., "A Novel Cell Technology Using N-doped GeSbTe Films for Phase Change RAM," 2003 Symposium on VLSI Technology Digest of Technical Papers, pp. 177-178.

Hwang, Y. N. et al., "Full Integration and Reliability Evaluation of Phase-change RAM Based on 0.24 μm-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA, 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L.; "Electrothermal and Phase-change Dynamics in Chalcogenide-based Memories," IEEE IEDM 2004, 4 pp.

Lai, Stefan, "Curret Status of the Phase Change Memory and Its Future," IEEE IEDM 2003, pp. 255-258.

Lai, Stephan et al., OUM-A 180 nm Nonvolatile Memory Cell Element Technology for Stand Alone and Embedded Applications, IEEE IEDM 2001, pp. 803-806.

Lankhorst, Martijn H. R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al., "Novel μTrench Phase-Change Memory Cell for Embedded and Stand-Alone Non-Volatile Memory Applications," 2004 Symposium on VLSI Technology Digest of Technical Papers, pp. 18-19.

Prakash, S. et al., "A Guideline for Designing Chalcogenide-Based Glasses for Threshold Switching Characteristics," IEEE Electron Device Letters, vol. 18, No. 2, Feb. 1997, pp. 45-47.

Rochefort, C. et al., "Manufacturing of High Aspect-Ration p-n Junctions Using Vapor Phase Doping for Application in Multi-Resurf Devices," IEEE 2002.

Strauss, Karl F. et al., "Overview of Radiation Tolerant Unlimited Write Cycle Non-Volatile Memory," IEEE 2000.

Subramanian, Vivek et al., "Low Leakage Germanium-Seeded Laterally-Crystallized Single-Grain 100-nm TFT's for Vertical Intergration Applications," IEEE Electron Device Letters, vol. 20, No. 7, Jul. 1999.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20 high%20density%20high%20performance%20phase%20change%20memory', 8 pages.

Wicker, Guy, "A Comprehensive Model of Submicron Chalcogenide Switching Devices," Doctoral Dissertation, Wayne State University, Detroit, MI, 1996.

Wolf, Stanley, Excerpt from: Silicon Processing for the VLSI Era-vol. 4, pp. 674-679, 2004.

Yi. J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

METHOD FOR FORMING SELF-ALIGNED THERMAL ISOLATION CELL FOR A VARIABLE RESISTANCE MEMORY ARRAY

REFERENCE TO RELATED APPLICATION

This application claims the benefit of U.S. Provisional Patent Application No. 60/754,161, entitled "Method for Forming Self-Aligned Thermal Isolation Cell for a Phase Change Memory Array" filed on 27 Dec. 2005. That application is incorporated by reference for all purposes.

BACKGROUND OF THE INVENTION

1. Field of the Invention

The present invention relates to non-volatile memory structures, and more specifically to memory devices employing Resistance Random Access Memory (RRAM) memory elements.

2. Description of Related Art

RRAM based memory materials are widely used in read-write optical disks and non-volatile memory arrays. These materials have at least two solid phases, including for example a generally amorphous solid phase and a generally crystalline solid phase. Laser pulses are used in read-write optical disks to switch between phases and to read the optical properties of the material after the RRAM.

RRAM based memory materials, such as chalcogenide based materials and similar materials, also can be caused to change phase by application of electrical current at levels suitable for implementation in integrated circuits. The generally amorphous state is characterized by higher resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the RRAM material cools quickly, quenching the RRAM process, allowing at least a portion of the RRAM structure to stabilize in the amorphous state. It is desirable to minimize the magnitude of the reset current used to cause transition of RRAM material from crystalline state to amorphous state. The magnitude of the reset current needed for reset can be reduced by reducing the size of the RRAM material element in the cell and of the contact area between electrodes and the RRAM material, so that higher current densities are achieved with small absolute current values through the RRAM material element.

One direction of development has been toward forming small pores in an integrated circuit structure, and using small quantities of programmable resistive material to fill the small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

Problems have arisen in manufacturing such devices with very small dimensions, and with variations in process that meets tight specifications needed for large-scale memory devices. It is desirable therefore to provide a memory cell structure having small dimensions and low reset currents, and a method for manufacturing such structure that meets tight process variation specifications needed for large-scale memory devices. It is further desirable to provide a manufacturing process and a structure, which are compatible with manufacturing of peripheral circuits on the same integrated circuit.

SUMMARY OF THE INVENTION

A non-volatile memory device with a self-aligned RRAM element. The memory device includes a lower electrode element, generally planar in form, having an inner contact surface. At the top of the device is an upper electrode element, spaced from the lower electrode element. A containment structure extends between the upper electrode element and the lower electrode element, and this element includes a sidewall spacer element having an inner surface defining a generally funnel-shaped central cavity, terminating at a terminal edge to define a central aperture; and a spandrel element positioned between the sidewall spacer element and the lower electrode, having an inner surface defining a thermal isolation cell, the spandrel inner walls being spaced radially outward from the sidewall spacer terminal edge, such that the sidewall spacer terminal edge projects radially inward from the spandrel element inner surface. A RRAM element extends between the lower electrode element and the upper electrode, occupying at least a portion of the sidewall spacer element central cavity and projecting from the sidewall spacer terminal edge toward and making contact with the lower electrode. In this manner, the spandrel element inner surface is spaced from the RRAM element to define a thermal isolation cell adjacent the RRAM element.

DETAILED DESCRIPTION

The following detailed description is made with reference to the figures. Preferred embodiments are described to illustrate the present invention, not to limit its scope, which is defined by the claims. Those of ordinary skill in the art will recognize a variety of equivalent variations on the description that follows.

Figure 1:
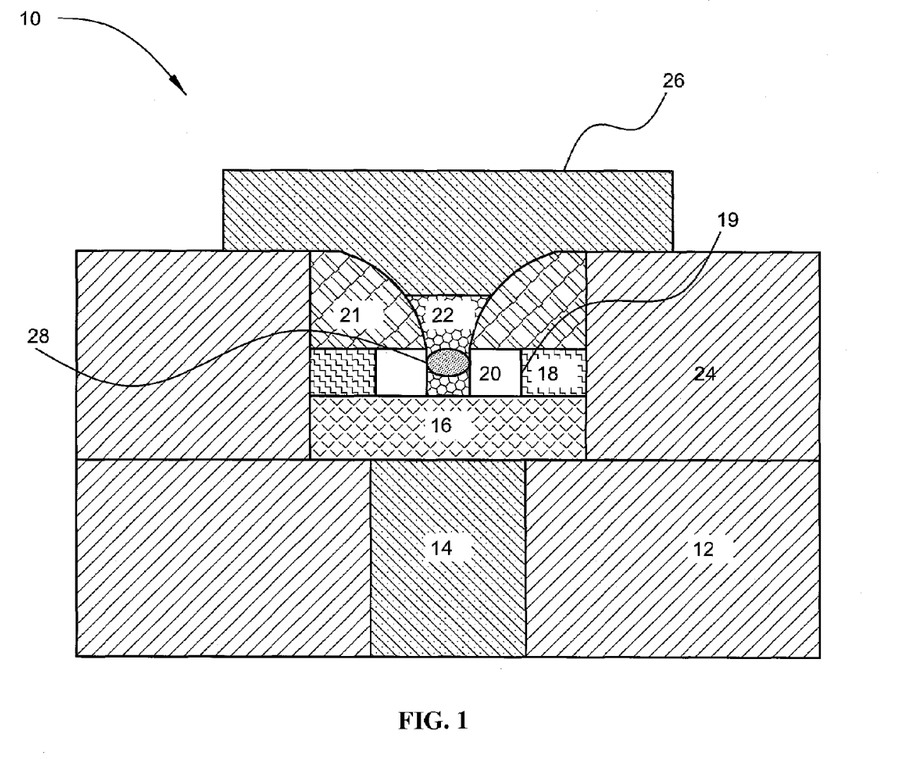
FIG. 1 illustrates an embodiment of a variable resistance memory element as claimed herein.

A memory element 10 is illustrated in FIG. 1. The element is fabricated on a substrate, or inter-layer dielectric layer, 12. The following discussion sets out the structure of this element, with the fabrication process following shortly thereafter. This layer preferably consists of silicon oxide or a well-known alternative thereto, such as a polyimide, silicon nitride or other dielectric fill material. In embodiments, the dielectric layer comprises a relatively good insulator for heat as well as for electricity, providing thermal and electrical isolation. An electrical contact, or plug, 14, preferably formed from a refractory metal such as tungsten, is formed in the oxide layer. Other refractory metals include Ti, Mo, Al, Ta, Cu, Pt, Ir, La, Ni, and Ru. The plug element makes electrical contact with an isolation or switching device, such as a transistor, located below the dielectric layer 12, as is known in the art. Other circuit components preferably located below the illustrated RRAM element include the common source lines and word lines, both of which are well-known in the memory art.

It should be noted that, for purposes of reference only, the direction from the bottom toward the top of the drawings herein is designated "vertical", and the side-to-side direction is "lateral" or "horizontal." Thus, "width" denotes a dimension parallel to the horizontal direction in the drawings, and "height" or "thickness" denotes a dimension parallel to the vertical. Such designations have no effect on the actual physical orientation of a device, either during fabrication or during use.

An lower electrode element 16 is formed atop the plug element 14. The lower electrode is preferably generally tabular in form and can be slightly wider than the plug element. It is formed from a metal such as copper, but other types of metallization, including aluminum, titanium nitride, and tungsten based materials can be utilized as well. Also, non-metal conductive material such as doped polysilicon can be used. The electrode material in the illustrated embodiment is preferably TiN or TaN. Alternatively, the lower electrodes may be TiAlN or TaAlN, or may comprise, for further examples, one or more elements selected from the group consisting of Ti, W, Mo, Al, Ta, Cu, Pt, Ir, La, Ni, and Ru and alloys thereof.

A spandrel element 18 is formed on the lower electrode element. As will be understood better in considering the spandrel element in the context of the embodiment as a whole, the material of which this element is composed will depend on choices made for adjacent layers. In general it can be said that that the overall criteria for this element are that it first function effectively as a spandrel in the environment of a memory device, and second that it offer the possibility of a highly selective etching process, as described below. Thus, the material to be employed here depends upon the materials chosen for the lower electrode element 16, discussed above, and the sidewall spacer element 21, discussed above. If, for example, the lower electrode element is composed of TiN, as is preferable, then suitable materials for the spandrel element could be W or Al or SiN, all of which offer the possibility of a high differential etch rate, as discussed below.

Figure 1A:
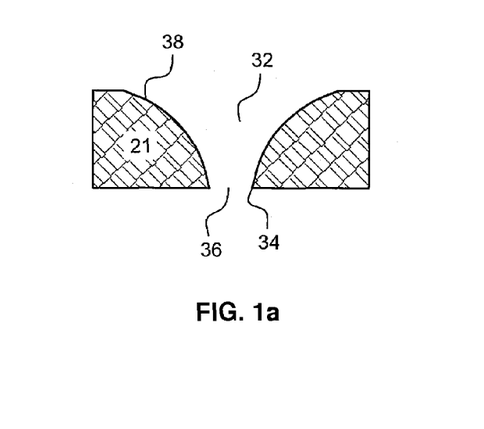
FIG. 1a depicts the sidewall portion of the embodiment of FIG. 1.

Sidewall spacer element 21 lies above and in contact with the spandrel element. This element is relatively thick compared with the lower electrode and spandrel, but it is coextensive with those elements in width. FIG. 1a is a detailed view of the sidewall spacer element, allowing its structure to be viewed more clearly. As can be seen there, the sidewall spacer element has a central cavity 32, generally funnel-shaped in form, with inner sides 38 of the sidewall spacer having a convex profile. The inner sides intersect with the bottom of the sidewall spacer to form terminal edges 34, which in turn define a central aperture 36. The sidewall spacer element is formed from a dielectric fill material.

As shown in FIG. 1, a portion of the sidewall spacer central cavity is filled with a RRAM element 22. This element fills the lower portion of the central cavity and extends downward to make contact with the lower electrode element.

The phase-change element 22 is formed from a material that can assume at least two stable resistance levels, referred to as resistance random access memory (RRAM) material. Several materials have proved useful in fabricating RRAM, as described below.

An important class of RRAM material is the chalcogenide group. Chalcogens include any of the four elements oxygen (O), sulfur (S), selenium (Se), and tellurium (Te), forming part of group VI of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from column six of the periodic table of elements, such as germanium (Ge) and tin (Sn). Often, chalcogenide alloys include combinations including one or more of antimony (Sb), gallium (Ga), indium (In), and silver (Ag). Because chalcogenides achieve their dual-memory capabilities by forming two solid phases, each of which exhibits a characteristic resistance, these materials are referred to as "RRAM" materials or alloys.

Many RRAM based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v. 3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a RRAM alloy that has programmable resistive properties. Specific examples of memory materials that may be useful are given in Ovshinsky '112 at columns 11-13, which examples are hereby incorporated by reference.

RRAM alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, RRAM materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

RRAM alloys can be changed from one phase state to another by application of electrical pulses. It has been observed that a shorter, higher amplitude pulse tends to change the RRAM material to a generally amorphous state. A longer, lower amplitude pulse tends to change the RRAM material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular RRAM alloy. In following sections of the disclosure, the RRAM material is referred to as GST, and it will be understood that other types of RRAM materials can be used. A material useful for implementation of a PCRAM described herein is $Ge_2Sb_2Te_5$.

Other programmable resistive memory materials may be used in other embodiments of the invention. One such material is a colossal magnetoresistance (CMR) material, which dramatically change resistance levels in the presence of a magnetic field. Such materials are generally manganese-based perovskite oxides, and the resistance changes encountered are generally in the range of orders of magnitude. A preferred formulation for RRAM applications is $Pr_xCa_yMnO_3$, where x:y=0.5:0.5, or other compositions in which x:0~1; y:0~1. Other CMR materials including an Mn oxide can also be employed.

Another RRAM material is a 2-element compound, such as $Ni_xO_y$; $Ti_xO_y$; $Al_xO_y$; $W_xO_y$; $Zn_xO_y$; $Zr_xO_y$; $Cu_xO_y$, where x:y=0.5:0.5. Alternatively, another compound in this group could be employed, in which x:0~1; y:0~1. Also, polymers employing dopants such as Cu, C60, Ag can be employed, including 7,7,8,8-tetracyanoquinodimethane (TCNQ), methanofullerene 6,6-phenyl C61-butyric acid methyl ester (PCBM), TCNQ-PCBM, Cu-TCNQ, Ag-TCNQ, C60-TCNQ, TCNQ doped with other metal, or any other polymer material that has bistable or multi-stable resistance state controlled by an electrical pulse.

Here the relationship between the sidewall spacer element, the RRAM element, the spandrel element and the lower electrode element should be noted. The spandrel element lies between the lower electrode and sidewall spacer elements, but the inner edges 19 of the spandrel element do not extend to make contact with the lower portion of the RRAM element. Rather, the spandrel inner edges are recessed from the sidewall spacer element terminal edges, so that the sidewall spacer, spandrel, lower electrode and RRAM elements enclose a void surrounding the RRAM element, thermal isolation cell 20. The spandrel element is surrounded by an inter-metal dielectric layer 24, which is preferably a dielectric fill material, such as SiO2.

Upper electrode element 26 lies on the sidewall spacer element, and a portion of the upper electrode extends into the central cavity to make electrical contact with RRAM element 22. This element is preferably formed from TiN or similar material, as discussed above. This electrode provides contact with other circuit elements, and in one embodiment it is in direct electrical contact a bit line (not shown).

Operation of the embodiment of FIG. 1 proceeds as follows. As noted above, the memory element 10 stores a data bit by altering the solid phase of RRAM element 22, causing the electrical resistance of that device to change as well. In its crystalline phase state, the RRAM element has a relatively low electrical resistance, while in the amorphous state its resistance is relatively high. Thus, one state can be chosen to represent a logical one and the other a logical zero, also referred to in the art as "high" and "low" logic levels. Thus, two signals are required to set the device state, a SET signal and one for RESET, chosen to produce the desired RRAM in the element. In one embodiment, the default level for the device is chosen to be the logical zero, or low, which is chosen to correspond to the high resistance (amorphous) state. Thus, the RESET signal is chosen as appropriate to produce the amorphous state. The SET signal, to produce the logic one level, is likewise chosen to produce the crystalline state. One other operation must be provided for, to sense a present level of the device in a READ operation. That signal is chosen below the level that will produce any RRAM.

These signals are generally initiated in control circuitry (not shown) which communicates with the circuitry immediately concerned with the memory element shown. In one embodiment such initiation proceeds by energizing the word line associated with the transistor controlling the element, turning that transistor on so that current flows through the transistor to plug element 14 and then through lower electrode 16, RRAM element 22 and upper electrode 26 and out to the bit line (not shown). That high current density in the most narrow area 28 of RRAM element 22 produces joule heating, which in turn leads to RRAM. The area 28 is by design located in the area of thermal isolation cell 20.

An embodiment of the process for fabricating the memory element of FIG. 1 is shown in FIGS. 2a-2h. Discussions above on the materials employed will not be repeated here.

Figure 2A:
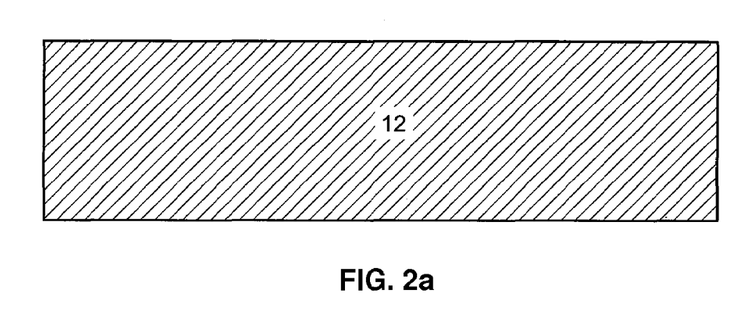
FIGS. 2a-2h illustrate an embodiment of a process for fabricating the embodiment of FIG. 1.
Figure 2B:
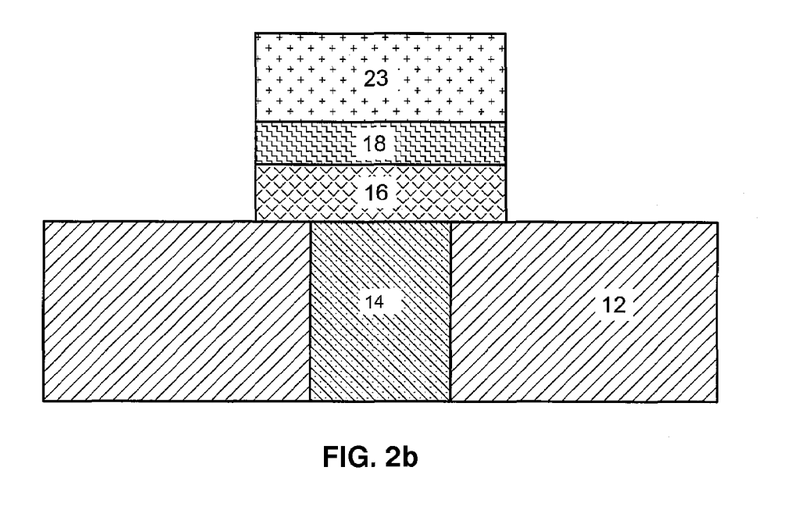

The process begins with deposition of the substrate, or inter-layer dielectric (ILD) 12, as depicted in FIG. 2a. Next, the plug element 14 is formed through the ILD, preferably by lithographically etching the opening and depositing the electrode material, followed by planarizing the ILD to remove any excess electrode material. Then three layers are deposited in succession—an electrode layer 16, a spandrel layer 18 and a sacrificial layer 23. Deposition of these layers can proceed as known in the art. The sacrificial layer 23 is preferably composed of silicon nitride, primarily for its ability to be preferentially etched in comparison with silicon dioxide. Following deposition, the width of these three layers is trimmed to a desired value, preferably employing conventional lithographic and etching methods.

Figure 2C:
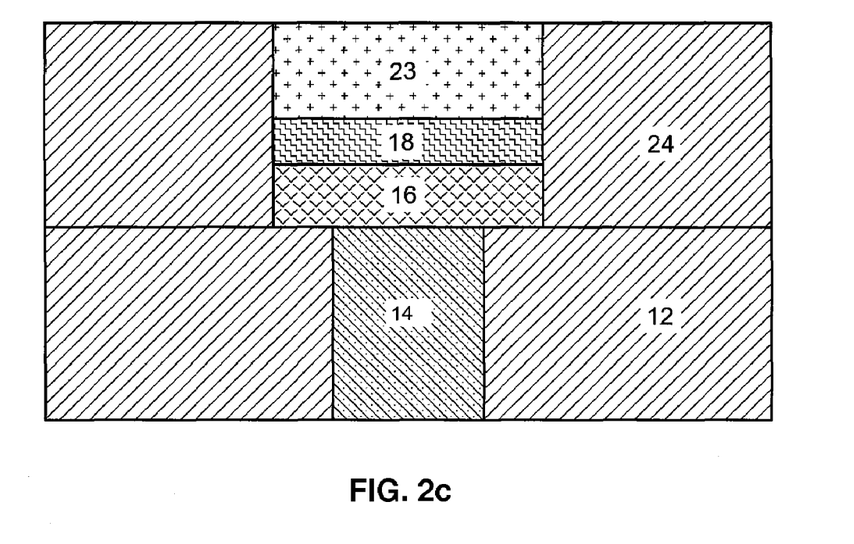
Figure 2D:
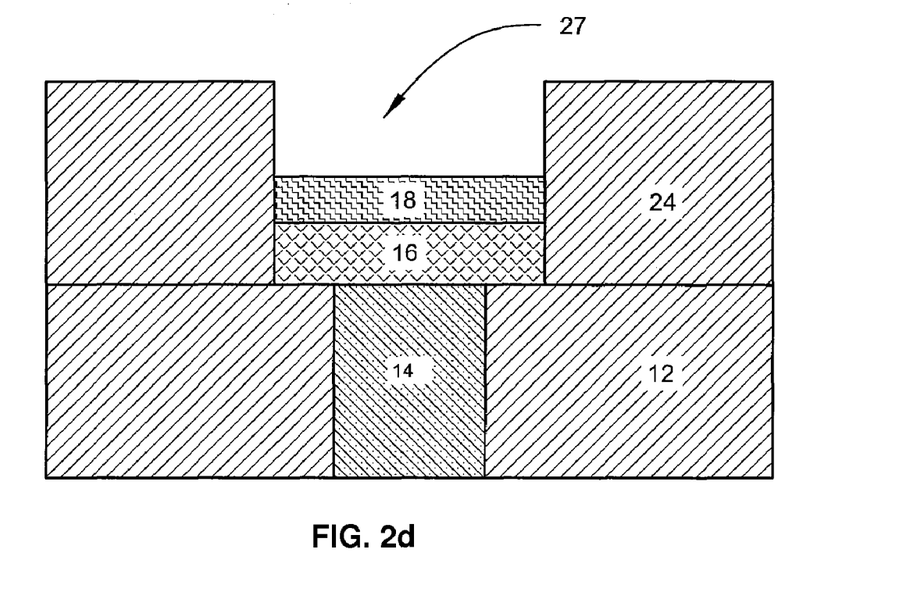

Next, as seen in FIG. 2c, an inter-metal dielectric layer (IMD) 24 is deposited or grown on the ILD, surrounding the trimmed layers. This layer is composed of suitable dielectric fill material, as discussed above. A planarization process, such as chemical-mechanical polishing (CMP) is employed to reduce the thickness of the newly-formed dielectric layer to a desired thickness, exposing the nitride layer 23. Next, as seen in FIG. 2d, the nitride layer is removed, leaving a void 27 in the upper surface of the IMD.

Figure 2E:
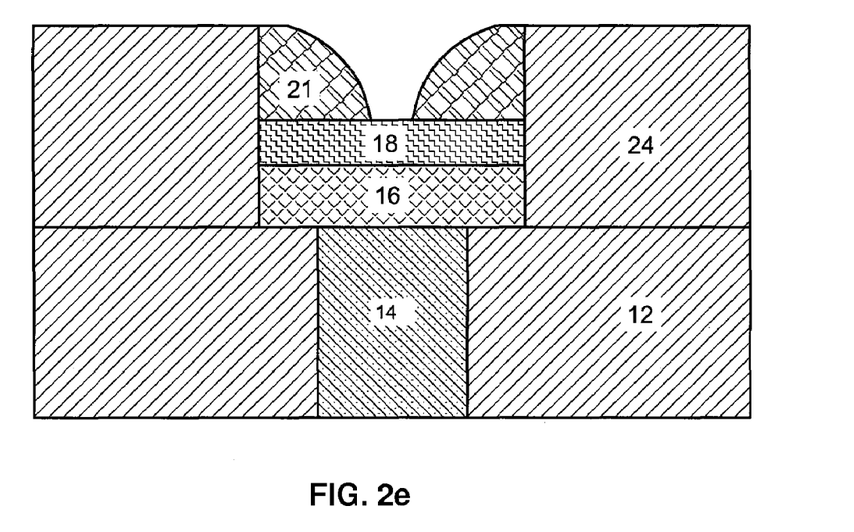

FIG. 2e depicts the initial formation of sidewall spacer 21, which is formed by deposition followed by etching, to produce a structure having a profile with convex sides of increasing thickness from top to bottom. Those in the art will understand that a number of known processes exist to accomplish this step, including the technique of sidewall spacer patterning. To accomplish that result, a layer of suitable material, such as an oxide dielectric material, is deposited on the structure shown in FIG. 2d. That material is then anisotropically etched to remove all material down to the level of the IMD 24, leaving a sidewall spacer 21 having sloping walls and a funnel-shaped central cavity 32, as discussed above. The etchant for this process is dependent on the exact materials, but assuming the spandrel 18 is W, then the preferred etchant for the oxide material is $CHF_3/CHF_4$ or $CH_3F/CHF_4$. either of those choices is highly selective for the oxide over the tungsten material.

Figure 2F:
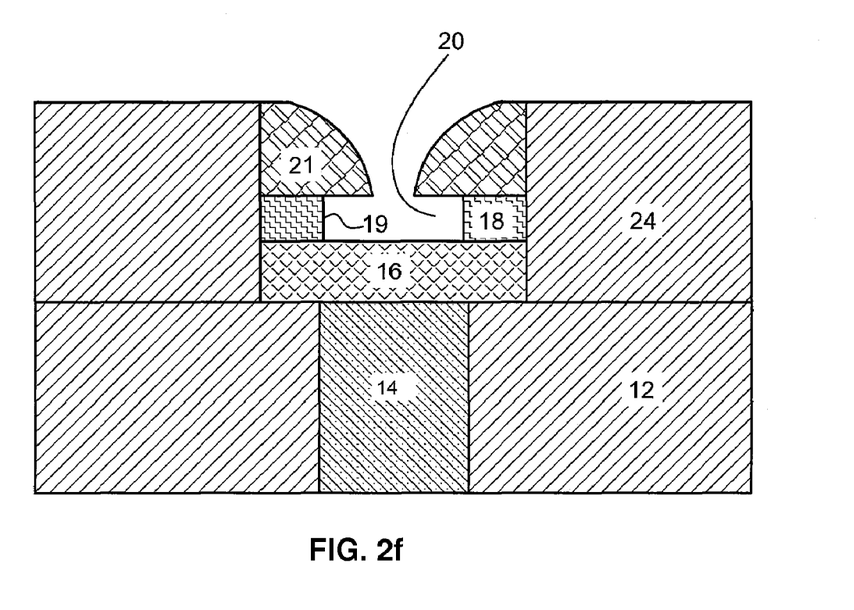

In the next step, the thermal isolation cell is formed, as shown in FIG. 2f. Preferably, this etching step is performed via a plasma etch, using a no-bias, isotropic process. Here the preferred etchant is $SF_6/O_2$, which will etch the oxide and TiN layers at a significantly slower rate than the W material of the spandrel. Of course, different materials will require a change in the etch material recipe.

The etchant acts selectively on the spandrel, leaving the sidewall spacer and underlying electrode relatively unaffected. The result is that the spandrel element is removed altogether in its central portion, with inner edges 19 substantially recessed from the central opening of the sidewall spacer.

Figure 2G:
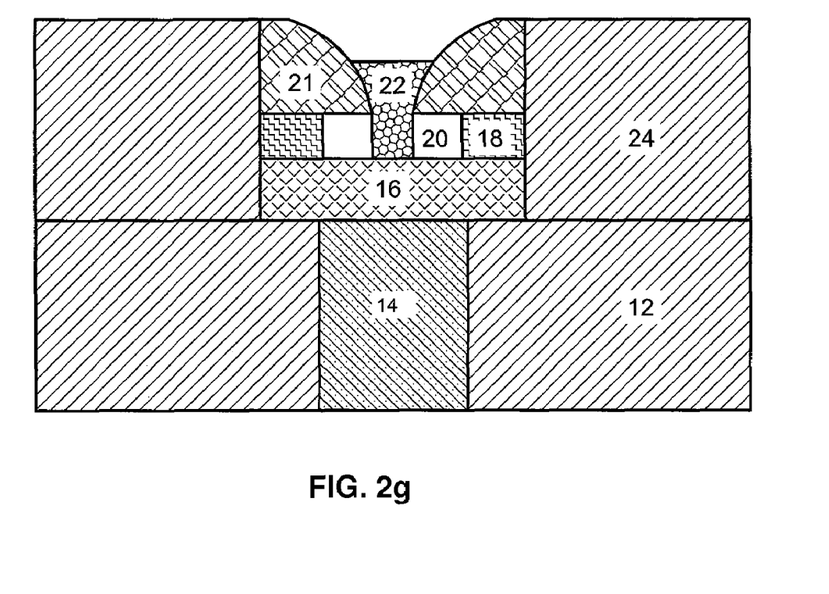

Next, in FIG. 2g, the RRAM element 22 is added, preferably by a deposition process. Here it is preferred to carry out the deposition with a sputtering process, which will produce a more conformal coating. Owing to the inward-sloping shape of the sidewall spacer, and its central opening, deposited GST material accumulates on the upper surface of electrode 16, building upward until it reaches the level of the sidewall spacer central opening, and thereafter the GST material proceeds to fill the sidewall spacer central cavity. It is preferred to continue the GST deposition until the sidewall spacer is filled, which also produces a layer of GST material on the ILD layer. A selective etching step is then undertaken, which removes all GST material on the ILD layer. In one embodiment, the etch is continued until the GST material is recessed into the sidewall spacer central cavity, as shown in FIG. 2g. This measure is preferred in order to ensure good contact between the RRAM element and the succeeding layer, as explained below. After this step, the RRAM element 22 is a flared shape, with its narrow end in contact with electrode 16. As a further consequence of the operations on the sidewall spacer, the RRAM element is self-aligned in the cell, centered on the electrode. Also, it is desirable that the narrowest segment of the RRAM element be just below the terminal edge of the sidewall spacer, and the sidewall spacer geometry can be designed to provide that result, as shown.

Figure 2H:
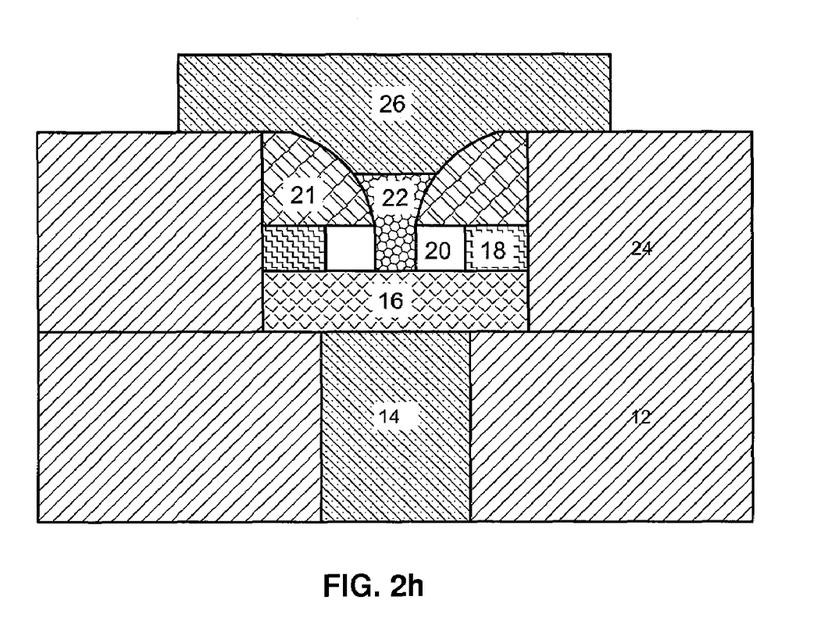

The final step is shown in FIG. 2h, in which the upper electrode 26 is deposited. This element, formed of TiN, as discussed above, is deposited, according to methods known in the art, so that material fills the remainder of the sidewall spacer, making contact with the RRAM element, and then forms a layer atop the ILD. The layer is reduced to a desired thickness, preferably using a CMP process, and then lithographically trimmed to a desired width, with the result as shown.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device, comprising:
a via within a dielectric fill;
a lower electrode element;
an upper electrode element;
a bottom spacer element within the via and over the lower electrode element, the bottom spacer element having an inner surface;
a sidewall spacer element on the bottom spacer element, the sidewall spacer element having an inner surface defining an opening substantially centered on the lower electrode element; and
a memory element within the opening defined by the inner surface of the sidewall spacer element and extending between the lower electrode element and the upper electrode element, the memory element spaced away from the inner surface of the bottom spacer element to define a thermal isolation cell.

2. The device of claim 1, wherein the memory element comprises a combination of Ge, Sb, and Te.

3. The memory device of claim 1, wherein the memory element comprises a combination of two or more materials from the group of Ge, Sb, Te, Se, In, Ti, Ga, Bi, Sn, Cu, Pd, Pb, Ag, S, and Au.

4. The memory device of claim 1, wherein the memory element exhibits variable resistance, such variability being associated with changes in phase structure.

5. The memory device of claim 1, wherein the bottom spacer element is composed of a material exhibiting high preferential etch properties relative to the sidewall spacer and lower electrode elements.

6. The memory device of claim 1, wherein the bottom spacer element is composed of tungsten, the sidewall spacer element is composed of a dielectric fill oxide, and the lower electrode element is composed of TiN.

7. The memory device of claim 1, wherein the upper electrode element extends below a top surface of the sidewall spacer element and into the opening defined by the inner surface of the sidewall spacer element to contact a top surface of the memory element.

8. The memory device of claim 1, wherein:
the lower electrode element has an outer surface;
the bottom spacer element has an outer surface; and
the sidewall spacer element has an outer surface aligned with the outer surfaces of the bottom spacer element and the lower electrode element.

9. The memory device of claim 8, wherein the upper electrode element is on a top surface of the dielectric fill.

10. The memory device of claim 9, wherein:
the sidewall spacer element extends to the top surface of the dielectric fill; and
the upper electrode element extends below the top surface of the dielectric fill and into the opening defined by the inner surface of the sidewall spacer element.

11. The memory device of claim 1, wherein the bottom spacer element comprises an electrically conductive material.

12. The memory device of claim 1, wherein:
the lower electrode element is within the via;
the via has a sidewall; and
the sidewall spacer element is on the sidewall of the via.

* * * * *